United States Patent [19]

Bilterijst

[11] Patent Number: 4,965,467
[45] Date of Patent: Oct. 23, 1990

[54] SAMPLING SYSTEM, PULSE GENERATION CIRCUIT AND SAMPLING CIRCUIT SUITABLE FOR USE IN A SAMPLING SYSTEM, AND OSCILLOSCOPE EQUIPPED WITH A SAMPLING SYSTEM

[75] Inventor: Jan A. Bilterijst, Enschede, Netherlands

[73] Assignee: U.S. Philips Corporation, New York, N.Y.

[21] Appl. No.: 324,375

[22] Filed: Mar. 16, 1989

[30] Foreign Application Priority Data

Mar. 21, 1988 [NL] Netherlands .................. 8800696

[51] Int. Cl.$^5$ .................. H03K 17/74; H03K 17/14
[52] U.S. Cl. ................................ 307/352; 307/319; 328/151; 340/700
[58] Field of Search .................. 307/319, 352, 353; 328/151; 340/700

[56] References Cited

U.S. PATENT DOCUMENTS

| 3,459,969 | 8/1969 | Jasper | 307/319 |
| 3,721,829 | 3/1973 | Benson | 307/352 |
| 4,399,413 | 8/1983 | Bosselaers | 307/352 |
| 4,647,795 | 3/1987 | Agoston | 307/352 |
| 4,810,904 | 3/1989 | Crawford | 307/319 |

Primary Examiner—John Zazworsky
Attorney, Agent, or Firm—Bernard Franzblau

[57] ABSTRACT

A sampling system (1) comprises a sampling circuit (2) for supplying a signal to be sampled and a pulse generation circuit (3) for generating two sampling pulses, which are opposite in phase, for the sampling circuit (2). In order to achieve as good a balance as possible and in order to minimize the influence of parasitic effects which affect the balance, charge storage components are formed as the distributed capacitance of a symmetrically coupled microstrip transmission line (pt11). Triggering and DC biasing of a step recovery diode (D3) in the pulse generation circuit is carried out outside of the characteristic environment of the step recovery diode (D3) at a potential node (e3) of a reflection transmission line (rt11, rt12).

14 Claims, 4 Drawing Sheets

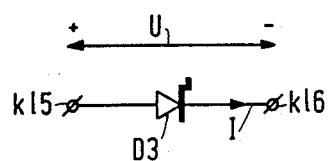
FIG.2A
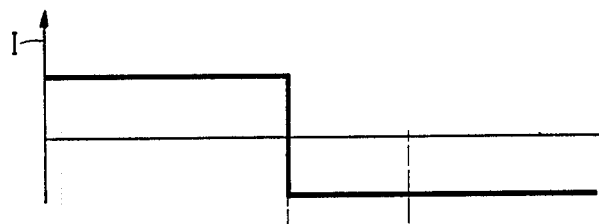
FIG.2B
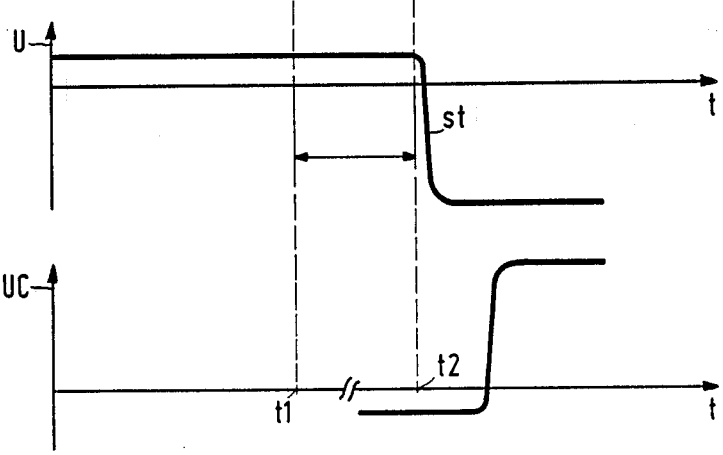
FIG.2C
FIG.2D
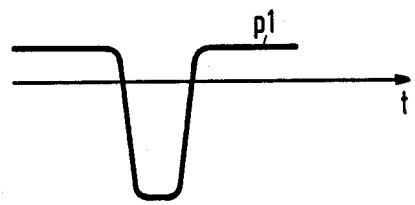
FIG.2E
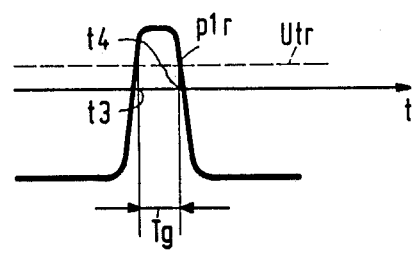
FIG.2F

SAMPLING SYSTEM, PULSE GENERATION CIRCUIT AND SAMPLING CIRCUIT SUITABLE FOR USE IN A SAMPLING SYSTEM, AND OSCILLOSCOPE EQUIPPED WITH A SAMPLING SYSTEM

BACKGROUND OF THE INVENTION

This invention relates to a sampling system comprising a sampling circuit having a signal input for supplying a signal to be sampled and having a first and a second pulse input for respectively supplying a first sampling pulse and a second sampling pulse whose phase is opposite to that of the first sampling pulse, and further comprising a pulse generation circuit, coupled to the sampling circuit via the pulse inputs, for generating the first and second sampling pulse.

The invention further relates to a pulse generation circuit and a sampling circuit suitable for use in such a sampling system.

The invention also relates to an oscilloscope equipped with such a sampling system.

Such a sampling system is known from the U.S. Pat. No. 3,241,076. In that case, as can be seen in FIG. 3, the pulse generation circuit having a mutually twisted two-wire signal line ("twisted pair") is connected to the sampling circuit. Furthermore, capacitors are used as charge storage components. In practice, the capacitors will have tolerances and will never be completely identical to each other. As a consequence of this design, imbalances will occur in the system, further intensified by imbalances in the pulse generation circuit itself. Temperature variations may also affect the capacitors. If such a sampling system is used, for example, in an oscilloscope with which it is required to measure signals of small amplitude, these imbalances may have a considerable effect. If there is, for example, 1% imbalance and if the input signal to be measured has an amplitude of 1 mV, an unbalanced pulse signal which itself has an amplitude of, for example, 3 V, will contribute 30 mV, a signal which is large compared with the input signal to be measured.

SUMMARY OF THE INVENTION

An object of the invention is to provide a sampling system which does not have such drawbacks.

A sampling system according to the invention is characterized in that the sampling system comprises balancing means for balancing the sampling system. As a result, a sampling of the input signal alone will in practice be obtained.

An embodiment of a sampling system according to the invention in which the sampling circuit comprises a first and a second sampling diode coupled to the signal input and furthermore first and second charge storage components, coupled to the first and the second sampling diode, for storing charge corresponding to the signal to be sampled, has the characteristic that the balancing means comprise the charge storage components which are formed by a first coupled planar transmission line and a ground plane disposed opposite the first planar transmission line, a first end of the first planar transmission line being coupled to the first and the second sampling diode and a second end to the first and second pulse input. The charge storage components are constructed as distributed capacitances. Very considerable balance can easily be achieved in planar transmission line technology. The signal input coupling of the pulse generation circuit will also be able to take place highly symmetrically via the first planar transmission line. The transmission line has a double function and is used both for signal transmission and for charge storage.

A further embodiment of a sampling system according to the invention, in which the sampling circuit comprises first and second output coupling resistors which are connected at one end to the respective sampling diodes, has the characteristic that the first and the second output coupling resistors are connected to the first planar transmission line by means of conductor tracks which are narrow compared with a track width of the first planar transmission line. A narrow conductor track presents a high impedance to very high frequencies. The parasitic effects of the output coupling resistors are therefore reduced.

A further embodiment of a sampling system according to the invention, in which the pulse generation circuit comprises a step recovery diode, which can be triggered by a control circuit, for forming a first and a second step-shaped signal, a first and a second reflection transmission line, coupled to the step recovery diode, for reflecting the step-shaped signals and a first and second output coupling transmission line coupled to the step recovery diode, is characterized in that the balancing means comprise the step recovery diode which is connected to a second coupled planar transmission line and is situated between a first and a second end of the second planar transmission line. The first end of the second planar transmission line then is coupled to the control circuit and the second end is coupled to a first and a second pulse output. The reflection transmission lines are formed by the section of the second planar transmission line between the first end and the step recovery diode, and the output coupling transmission lines is formed by the section of the second planar transmission line between the step recovery diode and the second end. Imbalances in the pulse generation circuit produce asymmetrical pulses as a result of which said drawbacks occur. For example, FIG. 2 of the U.S. Pat. No. 3,760,283 indicates that the control circuit is connected to the transmission lines via two conducting wires close to the step recovery diode. The characteristic environment of the step recovery diode is disturbed by this, as a result of which imbalances occur, inter alia, as a consequence of parasitic effects. As a result of the invention, these imbalances are also virtually eliminated. The environment of the step recovery diode remains characteristic as a result of triggering at the first end of the second planar transmission line. The triggering takes place in fact at a potential node with a potential of zero (a short-circuited transmission line). An additional advantage is that the bandwidth of the system can be altered simply by changing the position of the step recovery diode.

A further embodiment of a sampling system according to the invention has the characteristic that DC biasing means for the step recovery diode are coupled to the first end. As a result of this, the DC biasing for the step recovery diode does not have any disturbing effect either.

A further embodiment of a sampling system according to the invention has the characteristic that a first and a second DC decoupling capacitor are coupled immediately downstream of the output coupling transmission lines. Even if some imbalance occurs in output coupling as a consequence of differences in the capacitance values of the DC decoupling capacitors, this will largely be reduced by the transmission line of the sampling circuit. This is due to the fact that a transmission line has per se a balancing action.

An oscilloscope equipped with a sampling system according to the invention will be able to process even low-amplitude signals satisfactorily.

BRIEF DESCRIPTION OF THE DRAWINGS

The invention will be explained further by reference to the accompanying drawing in which:

FIG. 2A shows a step recovery diode and FIGS. 2B to 2F inclusive show the generation of pulses with the step recovery diode in the sampling system shown in FIG. 1.

DESCRIPTION OF THE PREFERRED EMBODIMENTS

Figure 1:
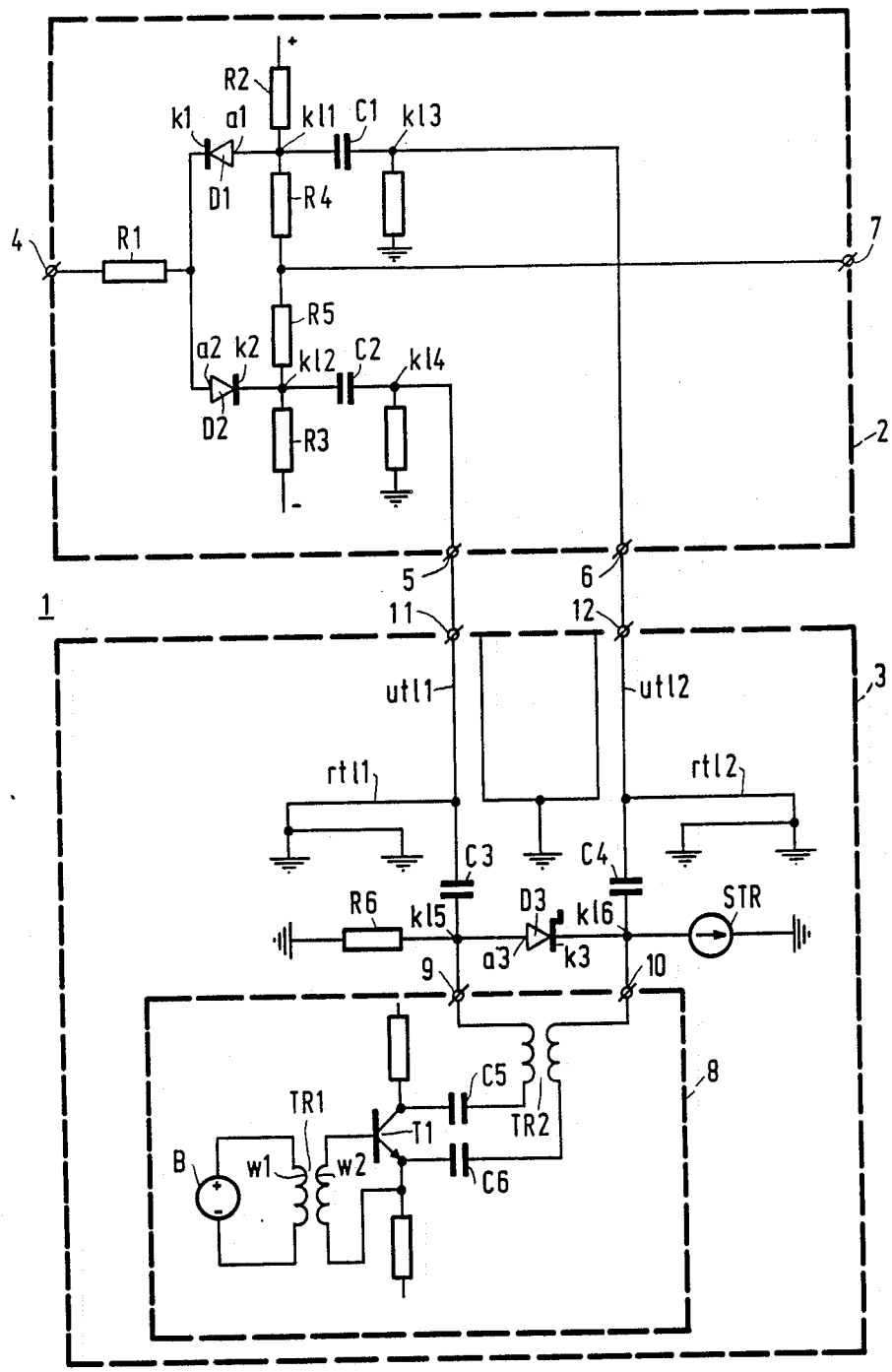
FIG. 1 shows a sampling system.

FIG. 1 shows a sampling system 1 such as is described, for example, in said U.S. Pat. No. 3,241,076. The sampling system 1 comprises a sampling circuit 2 and, in more detail than in the U.S. Pat. No. 3,241,076, a pulse generation circuit 3. The sampling circuit 2 has a signal input 4 for supplying a signal to be sampled, a first pulse input 5 for supplying a first sampling pulse, a second pulse input 6 for supplying a second sampling pulse of opposite phase to that of the first sampling pulse, and an output terminal 7 for taking off a sampling value. The sampling circuit 2 comprises a first sampling diode D1 whose cathode k1 is connected to the signal input 4 via a resistor R1 and a second sampling diode D2 whose anode a2 is connected to the signal input 4 via the resistor R1. The anode a1 of the diode D1 is connected to a connecting terminal k11 of a capacitor C1 which functions as a charge storage component and the cathode k2 of the diode D2 is connected to a connecting terminal k12 of a capacitor C2 also functions as a charge storage component. The connecting terminals k13 and k14 of the capacitors C1 and C2 are connected respectively to the second and the first pulse input 6 and 5. The diodes D1 and D2 are connected via resistors R2 and R3 to supply terminals (+, −) and to the output terminal 7 via a first and a second output coupling resistor R4 and R5. If pulses (not shown) are presented to the pulse inputs 5 and 6 with opposite phase, the diodes D1 and D2, which are reverse biased in the absence of the pulses, will conduct for a short time determined by the pulses. The conducting time is dependent on the biasing of the diodes via the resistors R2 to R5 inclusive and on the pulse shape. The pulses serve to sample an input signal, the charge storage components C1 and C2 containing a charge after sampling which is proportional to the input signal at the ti me of the sampling. The diodes D1 and D2 are so-called Schottky diodes which do not exhibit any internal charge storage at all. The pulses are generated by means of the pulse generation circuit 3 which comprises a step recovery diode D3 for forming a first and a second step-shaped signal (not shown) on terminals k15 and k16. The anode a3 of the step recovery diode D3 is connected to the terminal k15 and the cathode k3 to the terminal k16. DC biasing means for the step recovery diode D3 are formed by a power source STR and a resistor R6. The terminals k15 and k16 are further connected to respective connecting terminals 9 and 10 of a control circuit 8 which, for the purpose of initiating a sampling, delivers two pulses which are in opposite phase to each other. As will be further explained, the control circuit 8 may be relatively slow. The terminal k15 is coupled to a first reflection transmission line rt11 (via a first DC decoupling capacitor C3) and the terminal k16 to a second reflection transmission line rt12 (via a second DC decoupling capacitor C4). The terminals k15 and k16 are further coupled to respective output coupling transmission lines ut11 and ut12 (via the capacitors C3 and C4). The output coupling transmission lines ut11 and ut12 are coupled to the pulse inputs 5 and 6 via pulse outputs 11 and 12. The control circuit 8 comprises a voltage source B for delivering a step-shaped signal via a transformer TR1 and a transistor T1. A primary winding w1 of the transformer TR1 is connected to the source B and a secondary winding w2 to the base and the emitter of the transistor T1. The collector and the emitter of the transistor T1 are connected to a control transformer TR2 via decoupling capacitors C5 and C6 and the control transformer TR2 is connected to the connecting terminals 9 and 10. The source B generates a step-shaped signal in order to initiate the generation of pulses. Two pulses (in opposite phase) which are balanced with the transformer TR2 appear on the emitter and the collector of the transistor T1. The balanced pulses are presented to the step recovery diode D3 which has the characteristic of generating a signal with a very steep edge when triggered thereby.

The further operation of the pulse generator circuit 3 will be explained with reference to FIG. 2A which shows a step recovery diode D3 and FIGS. 2B to 2F inclusive which show the generation of pulses using the step recovery diode in the sampling system shown in FIG. 1. FIG. 2B shows a step-shaped current change in a current I due to the step recovery diode D3 as a consequence of the switching of the transistor TR1 by the source B as a function of time t, FIG. 2C shows a step-shaped change in a voltage U across the step recovery diode, FIG. 2D shows a step-shaped change UC of the voltage U across the step recovery diode after reflection by the reflection transmission line rt11, FIG. 2E shows a pulse p1 appearing on the pulse output 11, and FIG. 2F shows a pulse p1r superimposed on a DC voltage bias of the diode D1. If the step recovery diode D3 in FIG. 1 is not triggered, then the diode D3 is forward biased and the current I is, for example, 10 mA. If the step recovery diode D3 is triggered via the control transformer TR2 with two balanced (opposite in phase) pulses which are generated by switching the transistor T1, care being taken that the current through the transistor T1 is greater than 10 mA (for example, 20 mA), the direction of the current through the diode D3 will change, in FIG. 2B from 10 mA to −10 mA at t=t1. Before the switching, a considerable quantity of charge is stored in the step recovery diode D3. The step recovery diode D3 has the characteristic that the voltage U across it changes polarity only when all of the charge has drained out of the step recovery diode. This will be at t=t2 in the example shown. At t=t2, a very steep step-shaped signal will occur across the diode as a consequence of the change in polarity, the steepness of the edge of the step-shaped signal st being independent of the steepness of the triggering pulses. Two step-shaped signals st1 and st2 (not shown) which are opposite in phase and have a very steep edge are consequently produced on the terminals k15 and k16. The step-shaped signals st1 and st2 are propagated over the output coupling transmission lines ut11 and ut12 and also over the reflection transmission lines rt11 and rt12. After reflection, the pulses p1 and p2 (not shown) which are opposite in phase appear on the pulse outputs 11 and 12. The pulses p1 and p2 are superimposed on the DC bias of the diodes D1 and D2 in FIG. 1, as a consequence of which the diodes D1 and D2 will conduct for a certain time Tg. In FIG. 2F, the pulse p1 is shown as pulse p1r superimposed on the DC bias of the diode D1. When the pulse p1r rises above the forward voltage Utr of the diode D1 (approx. 0.6 V) in the time interval Tg between the instants t3 and t4, the diode D1 will conduct and if an input signal is present on the signal input 4, a signal current can flow and charge up the capacitor C1. Analogously, the capacitor C2 is charged up as a consequence of the pulse p2 which is opposite in phase. If there is an imbalance in the pulses p1 and p2, the charge on the capacitors will not only be a measure of the input signal on the signal input 4 but will also represent the imbalance. If the bandwidth of the system is, for example, 2 GHz, a pulse width of approx. 175 psec will be required. In these circumstances, the rise and fall times are in general less than 100 psec. The pulses p1 and p2 therefore contain relatively large high-frequency components. Parasitic components present in the system will disturb the symmetry and intensify the imbalance. Thus, with an input signal of 1 mV and a pulse amplitude of 3 V, an imbalance of 1% will produce a signal contribution of 30 mV originating from the pulses p1 and p2, a contribution which is large compared with the input signal to be measured. In regard to symmetry, critical sections of the sampling system 1 are, inter alia, the capacitors C1 and C2 and the environment of the step recovery diode D3. If the pulses p1 and p2 were to be presented with complete symmetry to the sampling circuit 2, inequality in impedances around the diodes D1 and D2 would produce the imbalance as a result of which the pulses p1 and p2 would partly appear as a signal during sampling. The inequality in impedances around the diodes D1 and D2 is determined to a considerable extent by imbalance in the capacitors C1 and C2.

Figure 3:
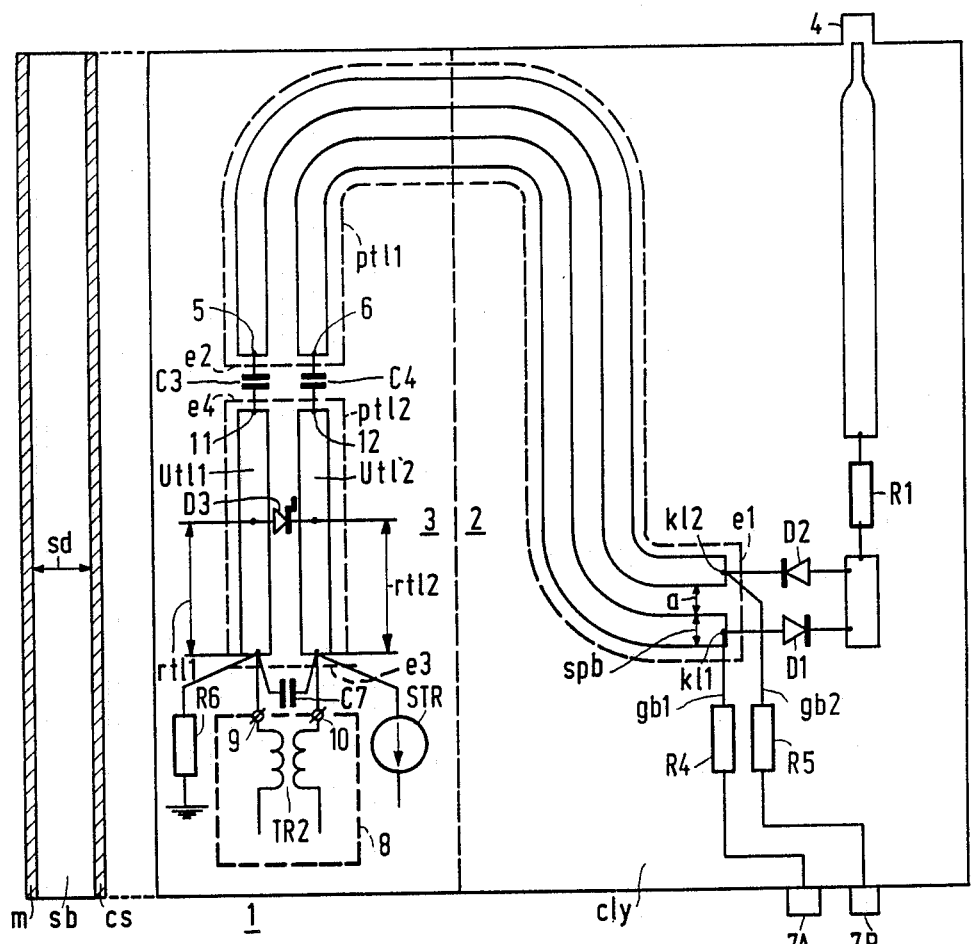
FIG. 3 shows a sampling system according to the invention.

FIG. 3 shows a sampling system according to the invention in which components corresponding to FIG. 1 are indicated in the same way. A component layout cly is shown on a substrate sb on which components are mounted on a component side cs opposite a ground plane m. The transmission lines for shaping and transmitting the pulses p1 and p2 are constructed using symmetrically coupled microstrip lines. According to the invention, the capacitors C1 and C2 are omitted and replaced by a symmetrically coupled transmission line for charge storage. FIG. 3 shows, at the end thereof, a first coupled planar transmission line pt11, a first end e1 of which is coupled to the first and second sampling diodes D1 and D2, and a second end e2 of which is coupled to the first and second pulse inputs 5 and 6. The transmission line pt11 has a dual function—to transmit pulses and as a charge storage component. The output coupling resistors R4 and R5 are coupled to the first end e1 of the transmission line pt11 by means of conductor tracks gb1 and gb2 which are narrow compared with the track width spb of the transmission line. At high frequencies, the impedance of the conductor tracks gb1 and gb2 will be high, as a result of which the parasitic effect thereon will minimal. The mutual spacing a of a pair of lines in the coupled planar transmission line is much smaller than the track width spb and the substrate thickness sd. The output coupling resistors R4 and R5 are connected respectively to a first and a second output terminal 7A and 7B. According to the invention, the step recovery diode D3 is situated on a second coupled planar transmission line pt12 between a first end e3 and a second end e4, and triggering and DC biasing take place at the first end e3 of the second coupled planar transmission line pt12. At the same time, the section of the second coupled transmission line pt12 between the step recovery diode D3 and the first end e3 is used as the reflection transmission lines rt11 and rt12. Step-shaped signals which are opposite in phase and which are generated with the step recovery diode D3 will be propagated from the step recovery diode D3 in the direction of the pulse outputs 11 and 12 and in the direction of the first end e3, where reflection takes place. Pulse-type signals which are opposite in phase and which are transmitted by the first coupled transmission line pt11 to the sampling circuit 2 will appear at the pulse inputs 5 and 6. The end e3 of the second coupled planar transmission line pt12 is high-frequency short-circuited with a short-circuiting capacitor C7. The triggering and the DC bias are therefore coupled to the short-circuited end of a transmission line at a potential node. The step recovery diode D3 is situated in a characteristic environment which is not disturbed by the triggering and the DC biasing. Altering the position of the step recovery diode D3 on the second transmission line pt12 alters the length of the reflection transmission line. It is therefore very simple to alter the bandwidth of the system. The first planar transmission line pt11 is DC-decoupled by a first DC decoupling capacitor C3 and a second DC decoupling capacitor C4 immediately downstream of the output coupling transmission lines ut11 and ut12. The transmission line pt11 has also to some extent a balancing effect per se. As is known from the theory of long lines, unbalanced triggering of two long lines will be balanced at the end thereof, providing the ends are floating.

Figure 4A:
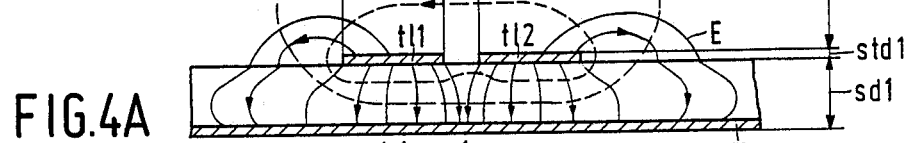
FIGS. 4A and 4B show symmetrically coupled microstrip lines in "even mode" and "odd mode", respectively, to make the invention more clear.
Figure 4B:
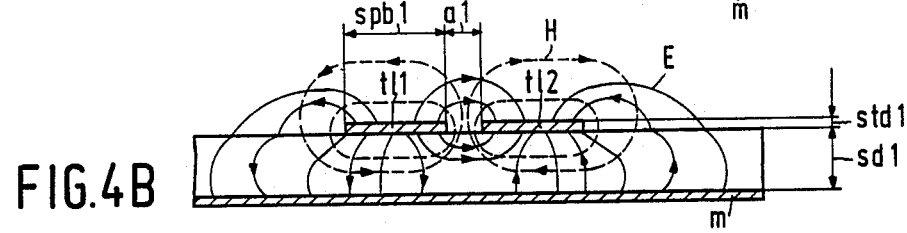

To make the invention clearer, FIGS. 4A and 4B show symmetrically coupled microstrip lines as transmission lines in respectively "even mode" and "odd mode". FIGS. 4A and 4B show a section through two symmetrically coupled transmission lines t11 and t12 having a mutual spacing a1, having track width spb1, having strip thickness std1 and having a substrate thickness sd1. The reference m indicates a ground plane. Continuous lines show a few electric field lines E and broken lines show a few magnetic field lines H for use as a transmission line in respectively "even mode" and "odd mode". In the "even mode", the coupled transmission lines t11 and t12 will have a characteristic impedance Z1 with respect to the ground plane m. In the "even mode", there is no difference in voltage between the transmission lines t11 and t12 and the ground plane m will serve as a current return path. In the "odd mode", the transmission lines t11 and t12 will have a characteristic impedance Z1 with respect to the ground plane m and a characteristic impedance Z2 with respect to each other. In general, Z2 will be greater than Z1. A comprehensive description of coupled microstrip lines will be found, for example, in "An Analytical Method for Calculating Microstrip Transmission Line Parameters", by S. V. Judd et al. IEEE Transactions on Microwave Theory and Techniques, Vol. MTT-18, No. 2, February 1970, pages 78-87. If the spacing al between the transmission lines t11 and t12 in the "odd mode" is small compared with the substrate thickness sd1 (the substrate will have a dielectric constant greater than 1), the ground plane m can be disregarded in the "odd mode". There will be a voltage difference between the transmission lines t11 and t12 and one transmission line serves as the return path for the current in the other transmission line. According to the invention, the pulses p1 and p2 are transmitted in the "odd mode". If a voltage step occurs across the step recovery diode D3, the impedance of the (reverse biased) step recovery diode will be high and the voltage step will appear essentially between the transmission lines. One transmission line will have a different potential from the other transmission line. When the sampling diodes D1 and D2 conduct, the signal to be sampled, which is on the signal input 4, is propagated over the first planar transmission line pt11 between the microstrip lines thereof and the ground plane m, that is to say in the "even mode". The charge storage components are formed by the first planar transmission line. The capacitance value of the charge storage components is determined by the total strip surface area of the transmission lines t11 and t12, the dielectric thickness sd1 and the dielectric constant. Charge storage may also take place in the DC decoupling capacitors C3 and C4, as a result of which the total capacitance value will be somewhat higher. If, for example, the distributed capacitance is 20 pF and the capacitance of the decoupling capacitors C3 and C4 is 2 pF, the total capacitance is 24 pF The sampling process is relatively fast and the sampling diodes D1 and D2 conduct only for a very short time. The transmission of the charge stored in the transmission line pt11 to subsequently processing circuits (not shown) can take place much more slowly.

Figure 5:
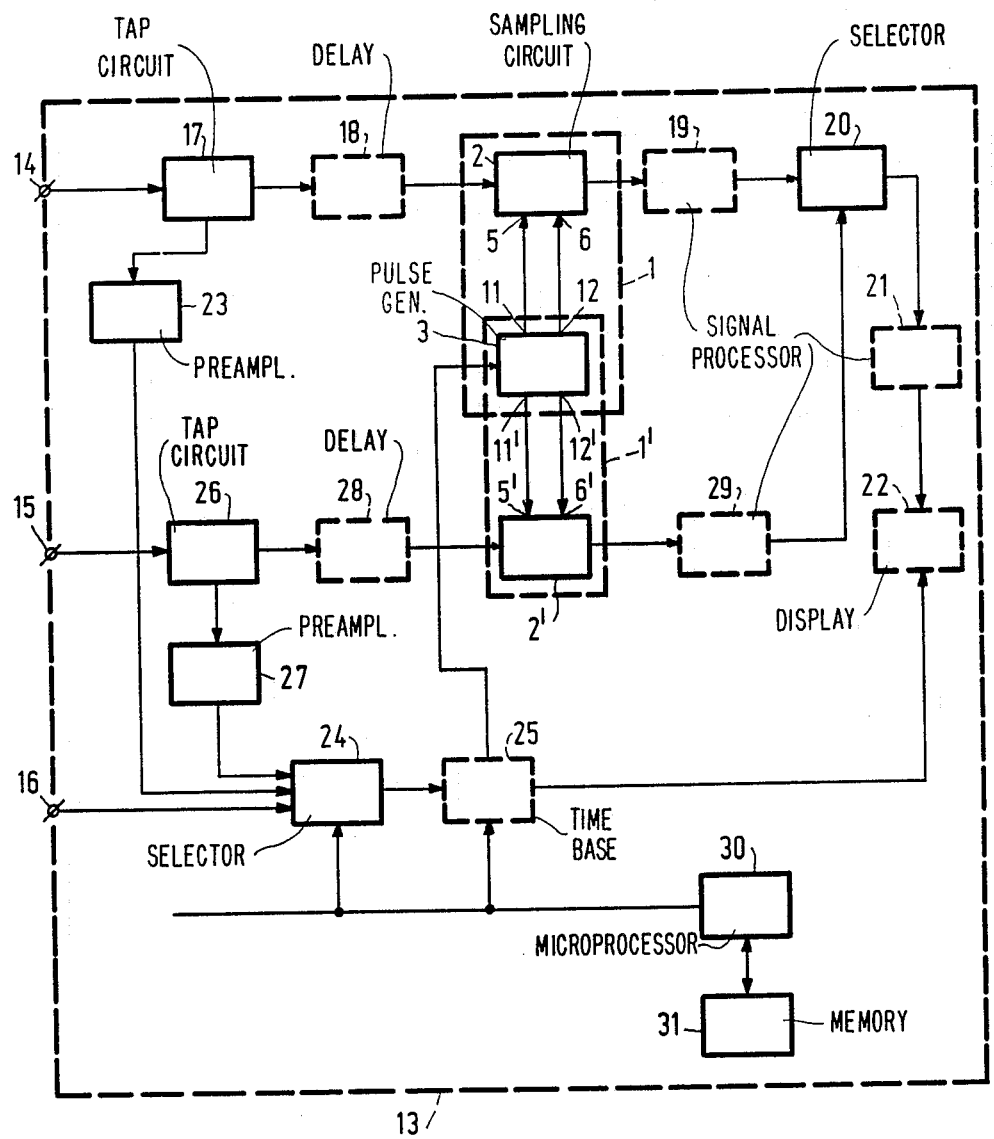
FIG. 5 shows a block diagram of an oscilloscope equipped with a sampling system according to the invention.

FIG. 5 shows a block diagram of an oscilloscope 13 equipped with a sampling system 1 according to the invention, in which diagram components corresponding to FIGS. 1 and 3 are indicated in the same way. The oscilloscope 13 comprises a first input channel 14, a second input channel 15, and an external trigger input 16. The first input channel 14 is coupled to the sampling system 1 via a trigger signal tapping circuit 17 and a delay line 18. Coupled to the sampling system 1 is a signal processing circuit 19 which is coupled to a channel selection switch 20 which is coupled via a further signal processing circuit 21 to a first input of a signal display unit 22. The trigger signal tapping circuit 17 is connected via a preamplifier 23 to a trigger selection circuit 24 which is connected to the signal display unit 22 via a time base circuit 25. The second input channel 15 is coupled in an analogous way to the signal display unit 22 (trigger signal tapping circuit 26, preamplifier 27, delay line 28, sampling system 1' (with sampling circuit 2', 5', 6', 11', 12'), and signal processing circuit 29). The external trigger input 16 is connected to the trigger selection circuit 24. The oscilloscope 13 further comprises a microprocessor 30 and a memory 31, inter alia, for signal processing and for controlling various oscilloscope functions.

I claim:

1. A sampling system comprising, a sampling circuit having a signal input for supplying a signal to be sampled and having a first and second pulse input for respectively supplying a first sampling pulse and a second sampling pulse in phase opposition, first and second sampling diodes coupling said signal input to a signal output of the sampling circuit, a pulse generation circuit, coupled to the sampling circuit via the pulse inputs, for generating the first and second sampling pulse, and means for balancing the sampling system, said balancing means comprising a microstrip transmission line symmetrically coupled between said first and second pulse inputs and said first and second sampling diodes.

2. An oscilloscope comprising:
    at least one signal input terminal,
    a signal display unit, and
    a sampling system as claimed in claim 1 wherein the signal input of the sampling circuit is coupled to said signal input terminal of the oscilloscope and said signal output of the sampling circuit is coupled to an input of the signal display unit.

3. A sampling system as claimed in claim 1 wherein the sampling circuit further comprises first and second output coupling resistors connected to said first and second sampling diodes, respectively, and to said transmission line by means of conductor strips which are narrower than a track width of the transmission line.

4. A sampling system as claimed in claim 1 wherein the pulse generation circuit comprises:
    a step recovery diode,
    a control circuit for triggering the step recovery diode on and off,
    a transmission line having one end coupled to said control circuit and another end coupled to said first and second pulse inputs of the sampling circuit,
    said step recovery diode being connected to said transmission line at a point intermediate said one end and said another end thereof whereby first and second pulse-type signals are produced in said transmission line.

5. A sampling system as claimed in claim 4 further comprising means for DC biasing the step recovery diode and coupled to said one end of the transmission line.

6. A sampling system as claimed in claim 4 wherein said another end of the transmission line is coupled to said first and second pulse inputs of the sampling circuit via first and second DC decoupling capacitors.

7. A sampling system as claimed in claim 1 wherein said first and second sampling diodes are connected in first and second parallel paths between said signal input and said signal output and with opposite polarity.

8. An oscilloscope comprising:
    a first and a second signal input terminal and a trigger input terminal,
    a signal display unit having an input,
    a sampling system as claimed in claim 1 including first and second sampling circuits each as claimed in claim 1,
    means coupling the signal inputs of the first and second sampling circuits to the first and second signal input terminals, respectively, of the oscilloscope,
    a selection switch coupled between the signal outputs of the first and second sampling circuits and said input of the signal display unit,
    a trigger selection circuit having first, second and third inputs coupled to said first signal input terminal, said second signal input terminal and said trigger input terminal, respectively, and
    a time base circuit having an input coupled to an output of the trigger selection circuit and an output coupled to a further input of the signal display unit.

9. A sampling system comprising; a sampling circuit which comprises a signal input for supplying a signal to be sampled and having a first and second pulse input for respectively supplying a first sampling pulse and a second sampling pulse in phase opposition, a pulse generation circuit, coupled to the sampling circuit via the pulse inputs, for generating the first and second sampling pulse, said sampling circuit further comprising: a first and a second sampling diode coupled to the signal input and first and second charge storage components, coupled to the first and the second sampling diode, for storing charge corresponding to the signal to be sampled, and means for balancing the system which comprise the charge storage components which are formed by a first coupled planar transmission line and a ground plane disposed opposite the first planar transmission line, a first end of the first planar transmission line being coupled to the first and the second sampling diode and a second end of said transmission line being coupled to the first and second pulse input.

10. A sampling system according to claim 9, wherein the sampling circuit comprises a first and a second output coupling resistor connected at one end to the respective sampling diodes, and the first and the second output coupling resistors are connected to the first planar transmission line by means of conductor tracks which are narrow compared with a track width of the first planar transmission line.

11. A sampling system according to claim 9, wherein the pulse generation circuit comprises a step recovery diode triggered by a control circuit for forming a first and a second step-shaped signal, a first and a second reflection transmission line, coupled to the step recovery diode, for reflecting the step-shaped signals, and a first and second output coupling transmission line coupled to the step recovery diode, wherein the balancing means comprise the step recovery diode which is connected to a second coupled planar transmission line and is situated between a first and a second end of the second planar transmission line, the first end of the second planar transmission line being coupled to the control circuit, the second end being coupled to a first and a second pulse output, the reflection transmission lines being formed by a section of the second planar transmission line between the first end and the step recovery diode, and the output coupling transmission lines being formed by a section of the second planar transmission line between the step recovery diode and the second end.

12. A sampling system comprising; a sampling circuit having a signal input for supplying a signal to be sampled and having a first and second pulse input for respectively supplying a first sampling pulse and a second sampling pulse in phase opposition, a pulse generation circuit, coupled to the sampling circuit via the pulse inputs, for generating the first and second sampling pulse, wherein the pulse generation circuit comprises a step recovery diode triggered by a control circuit for forming a first and a second step-shaped signal, a first and a second reflection transmission line, coupled to the step recovery diode, for reflecting the step-shaped signals, and a first and second output coupling transmission line coupled to the step recovery diode, and means for balancing the sampling system which comprise the step recovery diode which is connected to a coupled planar transmission line and is situated between a first and a second end of the planar transmission line, the first end of the planar transmission line being coupled to the control circuit, the second end being coupled to a first and a second pulse output, the reflection transmission lines being formed by a section of the planar transmission line between the first end and the step recovery diode, and the output coupling transmission lines being formed by a section of the planar transmission line between the step recovery diode and the second end.

13. A sampling system according to claim 12, characterized in that DC biasing means for the step recovery diode are coupled to the first end of the planar transmission line.

14. A sampling system according to claim 12, wherein a first and a second DC decoupling capacitor are coupled immediately downstream of the output coupling transmission lines.

* * * * *